United States Patent [19]
Walker

[11] 4,027,128
[45] May 31, 1977

[54] SCREW CONTACT SWITCH

[75] Inventor: Richard B. Walker, Lomita, Calif.

[73] Assignee: The Anaconda Company, New York, N.Y.

[22] Filed: Nov. 17, 1975

[21] Appl. No.: 632,581

[52] U.S. Cl. .............................. 200/158; 339/17 R; 361/400

[51] Int. Cl.² .......................................... H01B 3/40

[58] Field of Search ................. 200/158; 339/17 R; 317/101 CC, 101 R; 174/68.5

[56] References Cited
UNITED STATES PATENTS

| | | | |
|---|---|---|---|
| 2,854,552 | 9/1958 | Gouverneur | 339/17 R |
| 3,524,960 | 8/1970 | Lohff | 200/158 |

Primary Examiner—Herman J. Hohauser
Attorney, Agent, or Firm—William W. Haefliger

[57] ABSTRACT

A switch assembly connectible to a circuit board comprises
a. an insulative strip containing first, second and third openings spaced apart in a row,
b. two electrically conductive metallic prongs respectively extending through the strip via the first and third openings, and
c. a fastener having a threaded shank extending into the strip via the second opening and having an electrically conductive head adapted to engage or disengage both prongs at one side of the strip depending on the extent of rotation of the shank relative to the strip.

9 Claims, 5 Drawing Figures

SCREW CONTACT SWITCH

BACKGROUND OF THE INVENTION

This invention relates generally to strapping switches, and more particularly concerns manually selectively set switches useful on circuit boards.

In telephone as well as other circuits it is necessary to provide reliable, inexpensive means to manually switch between solder or other leads on circuit boards, such leads being connected with components such as attenuator pads, build-out networks, etc. Such switches must be capable of low-cost mass production and ease of mounting on PC boards.

Problems associated with prior switches of this nature included excessive time and labor involved in handling separate switch parts; disruption of solder by the movable switch element, causing bridging of split pads; damaging cutting of the solder and pad by the movable element; excessive time involved during testing to repair bridge pads, and the cost of replacing fully assembled boards. To my knowldge, no way was known, prior to the present invention, to solve all of these problems in the simple and effective manner as described herein.

SUMMARY OF THE INVENTION

It is a major object of the invention to provide a strapping switch assembly or assemblies characterized as simple, efficient, and overcoming the above as well as other problems associated with prior switches.

Basically, the assembly comprises:
a. an insulative strip containing first, second and third openings spaced apart in a row,
b. two electrically conductive metallic prongs respectively extending through the strip via the first and third openings, and
c. a fastener having a threaded shank extending into the strip via the second opening and having an electrically conductive head adapted to engage or disengage both prongs at one side of the strip depending on the extent of rotation of the shank relative to the strip.

As will be seen, the prongs typically have upper ends which are turned or extend oppositely toward one another at the side of the strip to be engaged by the fastener head, loading being transferred to the strip via such turned ends. Also, the strip is typically elongated and contains multiple groups of such openings and prongs; and the strip may be transversely weakened between such groups of openings, so that it may be broken apart, selectively, to provide sub-strips of selected length containing desired numbers of switch assemblies, as will be seen. Finally, the prong lower ends may project through a circuit board to receive solder application forming buttons to retain the strip to the board. Accordingly, adjustment of the switch to closed or open condition may be effected at the components installation side of the board, and solder application to the switch maybe effected at the main solder side of the board. This was not possible in prior boards, in the simple manner as now afforded by the invention.

These and other objects and advantages of the invention, as well as the details of an illustrative embodiment, will be more fully understood from the following description and drawings, in which:

DRAWING DESCRIPTION

DETAILED DESCRIPTION

Figure 1:
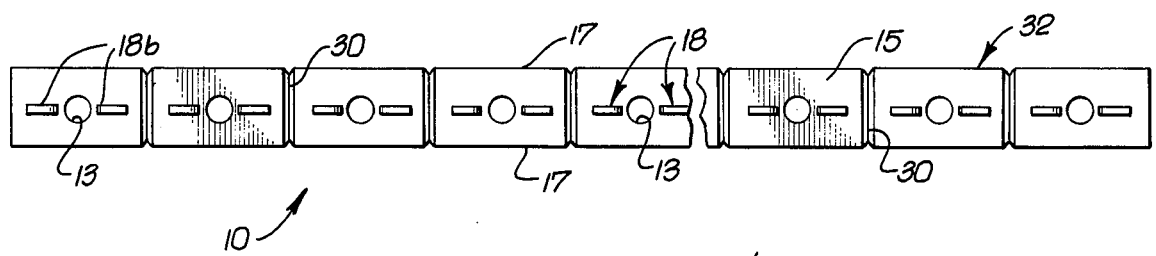
FIG. 1 is a top plan view of a switch strip.

The strapping switch assembly 10 shown in the drawings is connectible to circuit or mounting board 11. The assembly includes an insulative strip 32 which may consist of molded plastic material such as ORLON, NYLON, ABS, polyurethane, or LEXAN, by way of example. The strip, at each switch position, contains first, second and third openings 12, 13 and 14 respectively, and typically extending through the strip between the top and bottom 15 and 16 thereof, mid-way between opposite sides 17. The openings are spaced apart in a row extending longitudinally of the strip, as shown.

Figure 3:
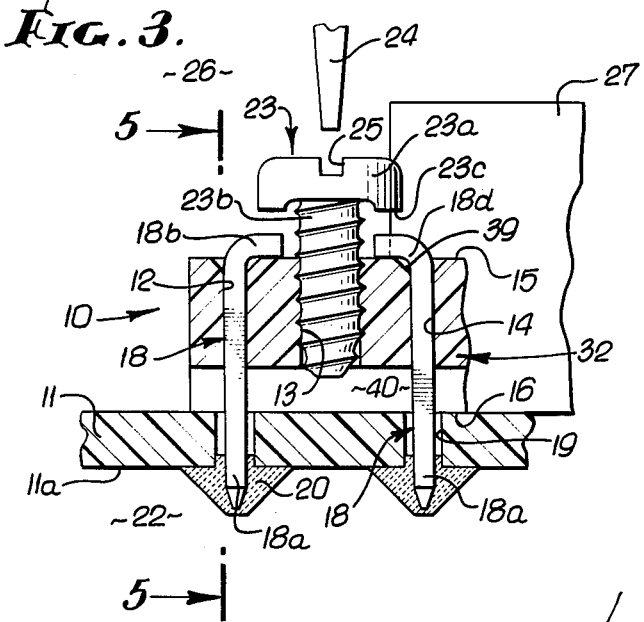
FIG. 3 is an enlarged vertical section through one switch showing the manner or its connection to a circuit board.
Figure 5:
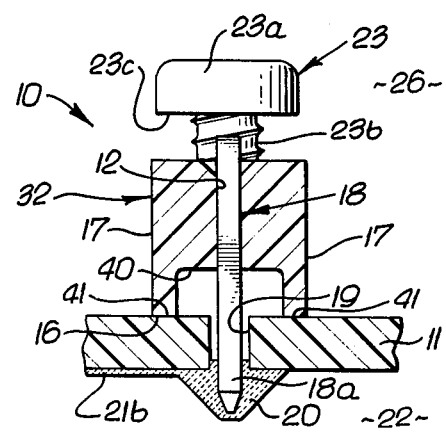
FIG. 5 is a section line 5—5 of FIG. 3.
Figure 4:
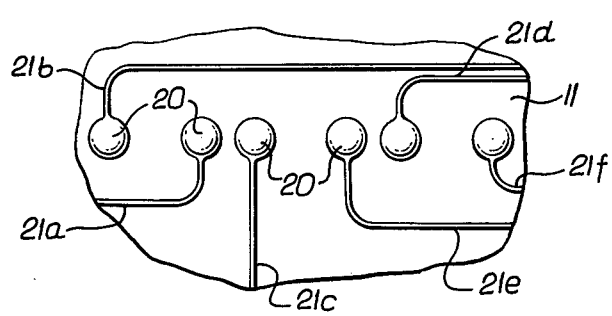
FIG. 4 is a fragmentary bottom plan view of the board shown in FIG. 3.

Two electrically conductive metallic leads or prongs 18 respectively extend through the strip via the first and third openings 12 and 14, at each switch position, a press fit being typical. These leads may consist of brass and may be plated with bright tin over nickel. The ends 18a of the prongs also project sufficiently below the strip to extend through openings 19 in the insulative circuit board 11, and to project below the latter as in FIG. 3, for example. They may then receive application of solder to form buttons 20 which serve two functions: first, the buttons retain the switch assembly 10 to the board 11 (solder tending to enter the openings 19 and to extend flatly against the underside 11a of the board, as shown); secondly, the buttons join with typical solder leads as indicated at 21a–21f in FIG. 4, at the solder side 22 of the board, to form the completed circuitry.

The prongs have certain or upper ends as indicated at 18b which are bent or extend oppositely toward one another to overlie the upper side of the strip 32. They are, accordingly, engageable by the head 23a of a fastener 23 whose threaded shank 23b extends within opening or bore 13, when the head is displaced downwardly thereagainst. Loading transmitted by the head to the ends 18b is transferred to the strip upper surface. Such downward displacement may be effected by rotation of the tip 24 of a screw driver received in head slot 25, the threaded shank 23b being self-tapping in bore 13.

The prong upper ends 18b also extend directly beneath the head annular land 23c to be firmly contacted by that land as the head is tightened downwardly, whereby good electrical contact is made between the prongs and head. The fastener and prongs may consist of electrically conductive material such as brass, with a tin over nickel coating. The nickel coating in each case may be about .00003 inches thick, and the tin about .0001 to .0002 inches thick. The upper side of the strip is countersunk at locations 39 to accommodate the curvature of the prongs at 18d.

It will be noted that the strip 32 and fastener heads 23a extend at the side 26 of the board at which electrical components 27 are located. Accordingly, the fastener heads may be selectively tightened down against the prong heads at the same time and side of the board that the components 27 are installed and adjusted, facilitating ease and reduced cost of assembly and/or testing. Likewise, flow soldering application to the board to form buttons 20 may be accomplished at the same time as solder circuit connections at side 22. Further, the strip or strips may be easily installed on a board at the same side as the components 27 are installed.

Figure 2:
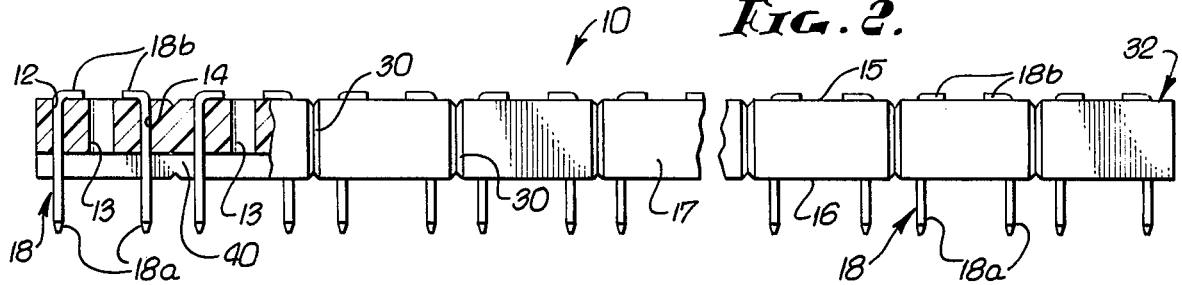
FIG. 2 is a side elevation of the FIG. 1 switch strip, and partly broken away to show interior construction.

Referring back to FIGS. 1 and 2 it will be seen that the strip 32 contains transverse peripheral grooving at 30 between the groups of openings 12–14. Such grooves serve to weaken the strip so that sections thereof may be broken apart inwardly adjacent the grooves, to provide selected length switch assemblies as needed.

The underside of the strip is relieved at 40, to support the strip squarely in the board at lateral locations 41.

I claim:

1. In a switch assembly connectible to a circuit board,
    a. an insulative strip containing first, second and third openings spaced apart in a row,
    b. two electrically conductive metallic prongs respectively extending through the strip via the first and third openings, and
    c. a fastener having a threaded shank extending into the strip via the second opening and having an electrically conductive head adapted to engage or disengage both prongs at one side of the strip depending on the extent of rotation of the shank relative to the strip,
    d. said prongs having certain ends extending toward one another at opposite sides of the fastener shank to be engaged by the fastener head, said ends remaining directly exposed to the fastener head,
    e. and the prongs extending through and freely below the strip via the first and third openings, and below the lowermost tip of the fastener shank remote from said head when the head engages said certain ends of both prongs.

2. In a switch assembly connectible to a circuit board
    a. an insulative strip containing first, second and third openings spaced apart in a row,
    b. two electrically conductive metallic prongs respectively extending through the strip via the first and third openings, and
    c. a fastener having a threaded shank extending into the strip via the second opening and having an electrically conductive head adapted to engage or disengage both prongs at one side of the strip depending on the extent of rotation of the shank relative to the strip
    d. the prongs having certain ends extending toward the fastener shank to be engaged by the fastener head, said certain ends being turned to form L-shaped prong configurations, the strip being locally relieved to receive prong bends formed by turning of said ends.

3. The switch assembly of claim 1, wherein the strip is longitudinally elongated and contains multiple groups of openings, each group including first, second and third openings as defined in claim 1, and prongs in said first and third openings and fasteners in said second openings, as in claim 1.

4. In a switch assembly connectible to a circuit board
    a. a longitudinally elongated insulative strip containing multiple groups of openings, each group including first, second and third openings spaced apart in a row,
    b. two electrically conductive metallic prongs respectively extending through the strip via the first and third openings of each group, and a fastener extending in the second opening of each group, and
    c. each fastener having a threaded shank extending into the strip and an electrically conductive head adapted to engage or disengage both prongs at one side of the strip depending on the extent of rotation of the shank relative to the strip,
    d. the strip containing peripheral grooving between said groups of openings and acting to weaken the strip so that sections thereof may be broken apart adjacent said grooving.

5. The switch assembly of claim 1 including said circuit board through which the prongs project, there being solder buttons extending about the ends of the prongs at the side of the board opposite the strip.

6. In a multiple strapping switch assembly connectible to a circuit board
    a. an elongated insulative strip containing longitudinally spaced groups of openings,
    b. each group including first, second and third openings spaced apart in a longitudinal row, and
    c. pairs of electrically conductive metallic prongs respectively associated with each group of openings, the two prongs of each pair respectively extending through and substantially below the strip via the first and third openings of each group,
    d. the second opening of each group sized to receive a fastener threaded shank so that the fastener head may be displaced to engage and disengage the prongs at the upper side of the strip,
    e. said prongs of each pair having certain ends extending toward one another at opposite sides of the second opening for the fastener shank to be engaged by the fastener head, said ends remaining directly exposed to engagement by the fastener head,
    f. and the prongs of each pair extending through and freely below the strip via the first and third openings, and below the lowermost tip of the fastener shank remote from said head when the head engages said certain ends of both prongs.

7. In a multiple strapping switch assembly connectible to a circuit board
    a. an elongated insulative strip containing longitudinally spaced groups of openings,
    b. each group including first, second and third openings spaced apart in a longitudinal row, and
    c. pairs of electrically conductive metallic prongs respectively associated with each group of openings, the two prongs of each pair respectively extending through the strip via the first and third openings of each group,
    d. the second opening of each group sized to receive a fastener threaded shank so that the fastener head may be displaced to engage and disengage the prongs at the upper side of the strip,
    e. the prongs of each pair having certain ends that extend oppositely toward one another at said upper side of the strip to be engaged by the fastener head, the prongs having other ends projecting from the lower side of the strip.

8. In a multiple strapping switch assembly connectible to a circuit board
    a. an elongated insulative strip containing longitudinally spaced groups of openings,
    b. each group including first, second and third openings spaced apart in a longitudinal row, and c. pairs of electrically conductive metallic prongs respectively associated with each group of openings, the two prongs of each pair respectively extending through the strip via the first and third openings of each group, d. the second opening of each group sized to receive a fastener threaded shank so that the fastener head may be displaced to engage and disengage the prongs at the upper side of the strip, e. the strip being reduced in transverse cross-sectional area at locations between said groups of openings to weaken the strip so that sections thereof may be broken apart at said locations.

9. The assembly of claim 6 wherein the prongs consist of brass plated with tin over nickel.

* * * * *